United States Patent [19]

Lee

[11] Patent Number: 5,811,874
[45] Date of Patent: Sep. 22, 1998

[54] SEMICONDUCTOR CHIP PACKAGE DEVICE HAVING A ROUNDED OR CHAMFERED METAL LAYER GUARD RING

[75] Inventor: Seong Min Lee, Kyungki-do, Rep. of Korea

[73] Assignee: Samsung Electronics Co., Ltd., Suwon, Rep. of Korea

[21] Appl. No.: 840,233

[22] Filed: Apr. 11, 1997

[30] Foreign Application Priority Data

Jul. 18, 1996 [KR] Rep. of Korea .................. 1996-29012

[51] Int. Cl.⁶ .................................................. H01L 23/495
[52] U.S. Cl. .......................... 257/666; 257/669; 257/676
[58] Field of Search ................................... 257/666, 676, 257/669

[56] References Cited

U.S. PATENT DOCUMENTS

| | | |
|---|---|---|
| 4,625,227 | 11/1986 | Hara et al. . |
| 4,952,999 | 8/1990 | Robinson et al. . |
| 5,023,699 | 6/1991 | Hara . |
| 5,293,064 | 3/1994 | Yoshimoto et al. . |
| 5,338,972 | 8/1994 | Mgoro . |

*Primary Examiner*—Mahshid D. Saadat
*Assistant Examiner*—S. V. Clark
*Attorney, Agent, or Firm*—Jones & Volentine, L.L.P.

[57] ABSTRACT

A semiconductor chip packaging device includes a lead frame electrically connected to the chip and mechanically supporting the chip; a metal layer guard ring formed along at least one peripheral edge of an active surface of the chip; at least one slit formed at corner parts of the chip; a passivation layer covering the metal layer guard ring, the chip and the lead frame; and a package body made of a molding resin encapsulating the passivation layer, the lead frame, the metal layer and the chip; the metal layer guard ring being chamfered or rounded at corner parts of the chip to reduce shear stresses at the corner parts of the chip.

15 Claims, 5 Drawing Sheets

SEMICONDUCTOR CHIP PACKAGE DEVICE HAVING A ROUNDED OR CHAMFERED METAL LAYER GUARD RING

BACKGROUND OF THE INVENTION

1. Field of the Invention

The present invention relates generally to a semiconductor chip package device, and more particularly, it relates to a semiconductor chip package device that is provided with a metal layer of rounded or chamfered shape which prevents shear deformation of the metal layer.

2. Description of the Related Art

The integrated circuit manufacturing process basically comprises the following major stages: wafer preparation, wafer fabrication, electric test (die sort) and assembly. In the wafer preparation stage, a crystal of silicon is first grown into a so-called ingot of a required diameter. The individual wafers are then sawed from the ingot. Each raw wafer is polished to optimal flatness and to the required thickness.

In the wafer fabrication stage, the semiconductor device or integrated circuit (IC) is created in and on the wafer surface through varied sophisticated processes depending on the particular function of the device. Although the actual number of steps the wafer goes through will vary depending on the type and complexity of the circuit being built during the wafer fabrication, there are three basic operations which are performed on the wafer, including: (1) layering, in which thin layers of different materials are grown on or added to the wafer surface; (2) patterning, in which portions of the thin layers are selectively removed from the wafer; and (3) doping, in which the resistivity and conductivity type of selected regions in the wafer are changed by the addition of dopants.

After the electrically active regions are created through the doping sequences in the wafer surface, the regions or components have to be wired together. In semiconductor technology, the wiring comprises a thin layer of aluminum that is deposited on the wafer surface, on top of the insulating layer of silicon dioxide or silicon nitride, in a so-called "metallization" process.

After the metallization process, the circuit or device is operationally complete. However, since the circuit is vulnerable to contamination and the thin fragile metallization layer is susceptible to scratching, the wafer is covered with a "passivation" layer that acts as a contamination barrier and protects the metal layer.

After the wafer fabrication stage, the wafer is separated into individual chips, mounted on a package base, and connected to a package lead. Thus, the good die which pass the electrical (die sort) tests are attached to a pad of a lead frame ("die attachment") and the chip is electrically connected to leads through wires ("wire bonding"). Then, the chip is encapsulated with a molding compound in order to protect the electrical interconnections and chip from the exterior environmental stresses.

The molding operation is carried out using a mold press. Tablets of molding compound or resin are melted by increasing the temperature of the press, and the hot melted molding compound is injected and cooled to room temperature, whereby the press gives shape to the package body.

However, when the chip is molded with the resin by the transfer molding technology it undergoes various stresses. The temperature of the molding resin material is lowered from a high temperature to a normal temperature and heat is transferred to the metal layer and to the passivation layer at different rates, resulting in stress and shear deformation, which consequently cause the package body and the layers to crack. Similar stresses and shear deformation are caused by the heat generated when the chip is in operation.

In particular, cracks due to stress occur mainly at the corners of the chip, or the portions of metal or the passivation layer at the corners of the chip, since the corners undergo the greatest stresses. Further, the cracks are proportional to the width of the metal layer.

In an attempt to reduce the stresses, U.S. Pat. No. 4,625, 227 to Yuji Hara et al. describes the formation of slits on the metal layer, as shown in FIGS. 1 through 5. FIGS. 1 and 2 are a plan view and a partial view of the slit configurations formed on the metal layer of the semiconductor chip package devices, respectively, and FIG. 3 is a cross-sectional view taken along the line 3—3 in FIG. 2. FIGS. 5*a* through 5*d* are plan views showing the various shapes of the slits formed on the metal layer (or metal conductor ring) at the corners of the chip. The guard ring is used for strengthening the passivation layer in the semiconductor substrate surface. It can also be used as wiring for applying the ground potential or power source potential of a circuit.

With reference to FIG. 1, the semiconductor chip (100) is provided with a metal layer and metal guard ring (112) by a conventional chemical vapor deposition method, and slits (110) are formed at the corners of the metal layer (112). FIG. 2 is an enlarged partial view of FIG. 1, and FIG. 3 is a cross-sectional view taken along the line 3—3 in FIG. 2, showing the structure of the chip.

With reference to FIGS. 1 through 3, the metal layer (112) is formed at right angles along the peripheral edge of one major surface of a tetragonal semiconductor substrate (100) and is provided with "L-shaped" slits (110) at the corner parts of the substrate (100).

More specifically, the substrate (100) is covered with insulating film (120) and then metal layer (112). Bonding pads (116) are then formed on its major surface, and the bonding pads (116) are electrically connected to leads (114). The metal layer (112), bonding pads (116) and leads (114) are covered with passivation layer (118) for protection from the environment.

As described above, the semiconductor substrate (100) undergoes shear stresses during a transfer molding process wherein the metal layer (112) and passivation layer (118) are encapsulated with a molding resin material to provide a package body. FIG. 4, which is graph of the distribution of stresses which arise in a chip (100) plane due to the transfer molding process, shows that the shear stress is at a maximum at the corner of the semiconductor device.

FIGS. 5*a* through 5*d* show various conventional shapes of slits and arrayed openings formed at the corner parts of the metal layer guard on the chip. For example, FIG. 5*a* shows an "L-shaped" slit (110), FIG. 5*b* shows an "L-shaped" row of openings (122), FIG. 5*c* shows parallel "L-shaped" slits (110A, 110B), and FIG. 5*d* shows parallel "L-shaped" rows of openings (122A, 122B).

When the chip having the structure described above is subjected to the molding process, the heat from the high temperature molding resin is transferred to the metal and passivation layers, resulting in a shear stress on the layers due to a difference in the thermal expansion coefficient between the molding resin and the silicon substrate. Although the amount of the stress is largely reduced with the addition of slits in the metal layer, compared with the case where the metal layer has no slits, there are still significant shear stresses on the metal and passivation layers.

Since the extent of shrinkage for the materials of the chip, the metal layer and the passivation layer are not the same, shear stresses are applied on the metal layer resulting in the deformation of the metal layer, and, in the worst case, cracks in the passivation layer and its underlying metal layer.

FIG. 6 is a cross-sectional view showing the shear deformation of the metal layer guard ring provided with slits for a conventional semiconductor chip device. A shear stress applied on the metal (112) and passivation (118) layers may be expressed by $$\tau = G_\chi (W-S)/2t_m * (W+2t)$$

in which $t_m$ is the thickness of the metal layer, W is the width of the metal layer, G is the shear constant of the passivation layer, $\chi$ is the displacement of the metal layer, t is the thickness of the passivation layer, and S is the width of the slit. Reference letter B in FIG. 6 indicates the direction of shear displacement. From the above formula, it can be understood that the shear stress can be reduced by increasing the slit width (S).

Also, if the metal layer and the slits are formed to have right angled corners as in FIGS. 5a through 5d, the right angled slit corner itself becomes a point of stress concentration (stress=force/area), resulting in the breaking or cracking of the passivation layer, which in turn results in the production of defective semiconductor chip packages.

SUMMARY OF THE INVENTION

Thus, an object of the invention is to provide a semiconductor chip device having a metal layer guard ring formed along peripheral edges of a major surface of the chip and a passivation layer formed on the metal layer guard ring, in which the metal layer guard ring is chamfered or rounded at its corner parts so that shear deformation and cracks of the metal and passivation layers can be prevented.

According to one aspect of the present invention, there is provided a semiconductor chip device having a metal layer guard ring formed along peripheral edges of a major surface of the chip and a passivation layer formed on the metal layer guard ring, the metal layer guard ring having chamfered or rounded corner parts and being provided with discrete slits formed along the corner parts.

According to other aspect of the present invention, there is also provided a semiconductor chip device having a metal layer guard ring formed along peripheral edges of a major surface of the chip and a passivation layer formed on the metal layer, the metal layer guard ring having chamfered or rounded corner parts and being provided with discrete slits formed along the corner parts, with the slits having circular-shaped tips with a diameter larger than the width of the slit.

According to another aspect of the present invention, there is provided a semiconductor chip packaging device comprising a semiconductor chip; a lead frame electrically connected to the chip and mechanically supporting the chip; a metal layer guard ring formed along at least one peripheral edge of an active surface of the chip; at least one slit formed on the metal layer guard ring at corner parts of the chip; a passivation layer covering the metal layer guard ring, the chip and the lead frame; and a package body made of a molding resin encapsulating the passivation layer, the lead frame, the metal layer and the chip; the metal layer guard ring being chamfered at corner parts of the chip.

According to still another aspect of the present invention, there is provided a semiconductor chip packaging device comprising a semiconductor chip; a lead frame electrically connected to the chip and mechanically supporting the chip; a metal layer guard ring formed along at least one peripheral edge of an active surface of the chip; at least one slit formed on the metal layer guard ring at corner parts of the chip; a passivation layer covering the metal layer guard ring, the chip and the lead frame; and a package body made of a molding resin encapsulating the passivation layer, the lead frame, the metal layer and the chip;

the metal layer guard ring being rounded at corner parts of the chip.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

The present invention will now be described in more detail with reference to accompanying drawings.

Figure 1:
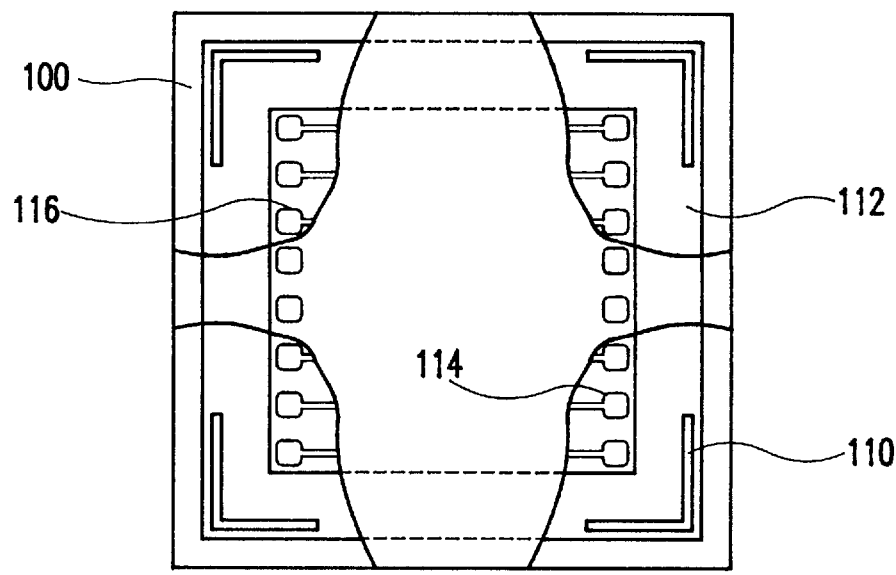
FIG. 1 is a plan view showing a conventional metal layer guard ring having slits, the metal layer guard ring being formed along peripheral edges of a chip of a semiconductor chip package device.
Figure 2:
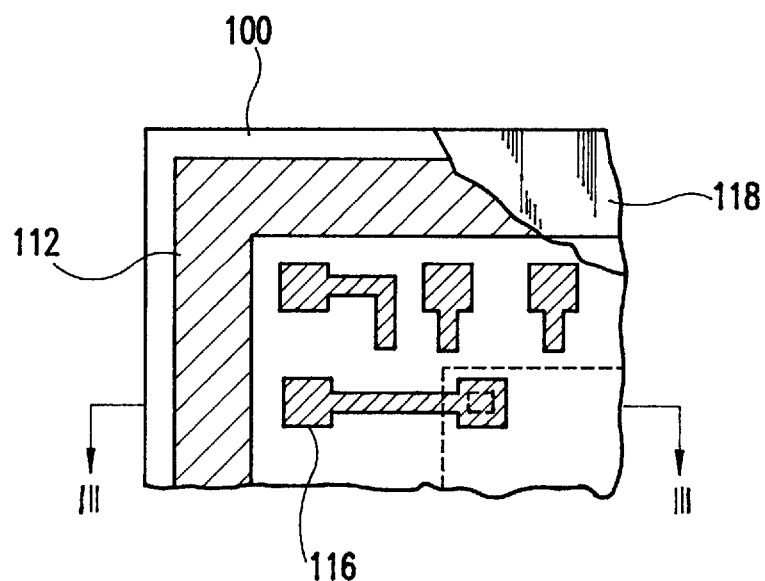
FIG. 2 is an enlarged view showing the slits in FIG. 1.
Figure 3:
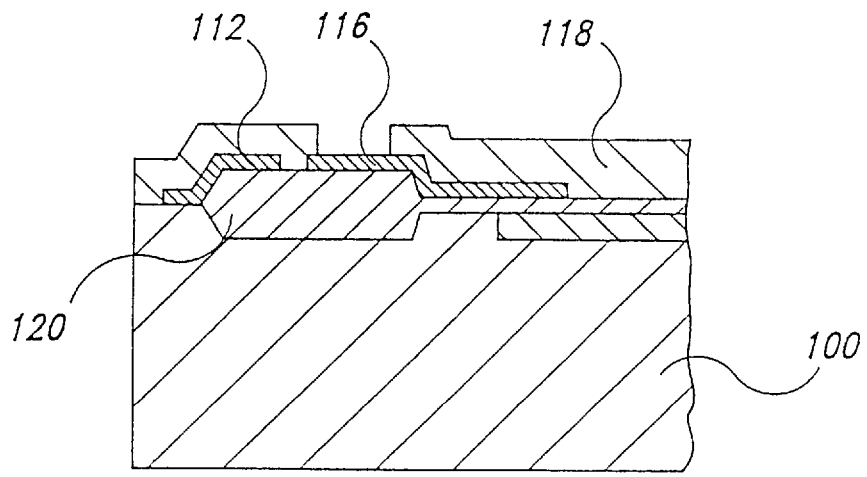
FIG. 3 is a cross-sectional view taken along the line 3—3 of FIG. 2.
Figure 4:
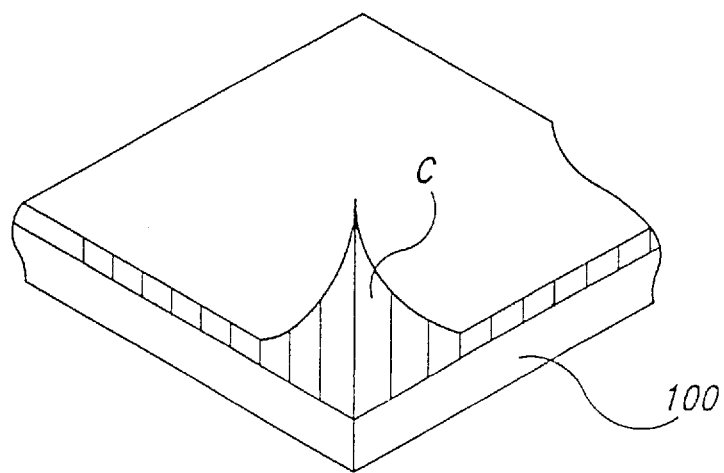
FIG. 4 shows the distribution of shear stress on the chip of a conventional semiconductor chip package device.
Figure 5A:
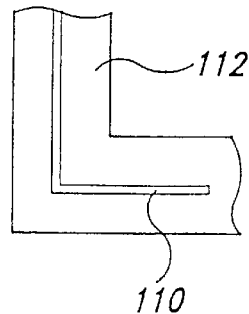
FIG. 5a is a partial plan view showing an "L-shaped" slit formed on a metal layer guard ring on the chip of the conventional semiconductor chip package device.
Figure 5B:
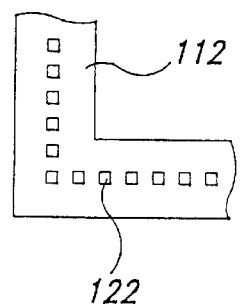
FIG. 5b is a partial plan view showing an "L-shaped" row of a plurality of openings, the openings being formed on a metal layer guard ring on the chip of the conventional semiconductor chip package device.
Figure 5C:
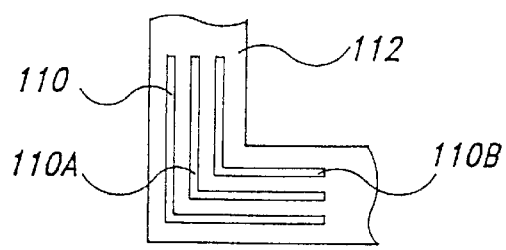
FIG. 5c is a plan view showing a plurality of parallel "L-shaped" slits formed on a metal layer guard ring on the chip of the conventional semiconductor chip package device.
Figure 5D:
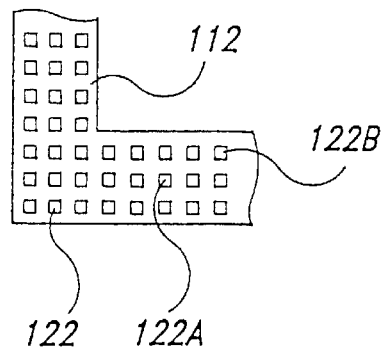
FIG. 5d is a partial plan view showing parallel "L-shaped" rows of a plurality of openings, the openings being formed on a metal layer guard ring on the chip of the conventional semiconductor chip package device.
Figure 6:
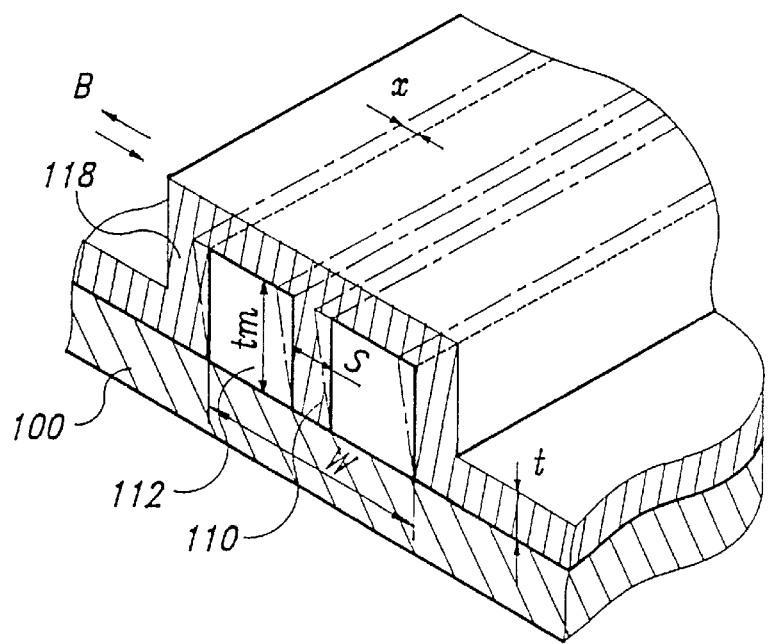
FIG. 6 is a sectional view showing a shear deformation of a metal layer guard ring provided with slits and of a passivation layer on the chip of the conventional semiconductor chip package device.
Figure 7:
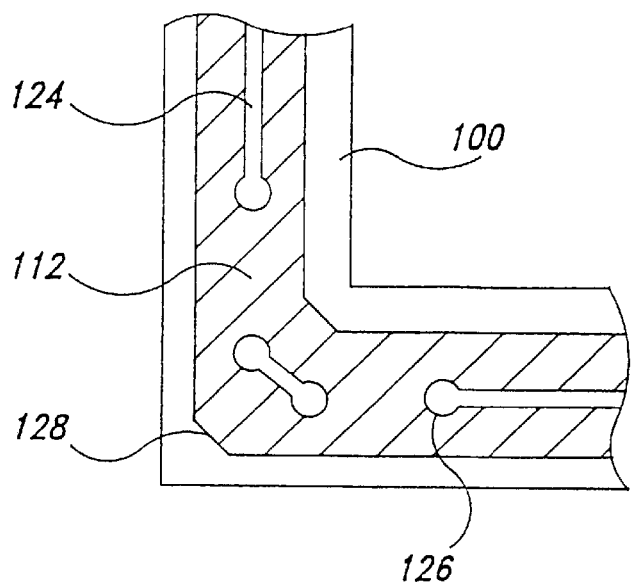
FIG. 7 is an enlarged partial view showing one embodiment of the present invention in which a metal layer guard ring is formed along peripheral edges of the chip of the semiconductor chip package device, the guard ring being chamfered at its corner parts.
Figure 8:
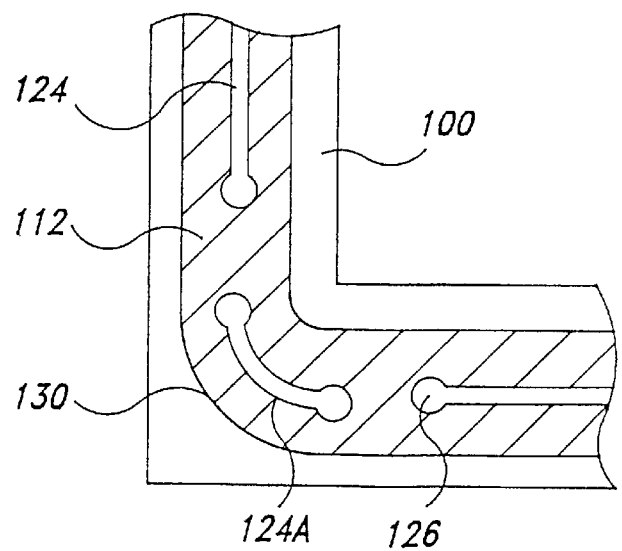
FIG. 8 is an enlarged partial view showing another embodiment of the present invention in which a metal layer guard ring is formed along peripheral edges of the chip of the semiconductor chip package device, the guard ring being rounded at its corner parts.

FIG. 7 is an enlarged partial view showing one embodiment of the present invention in which a metal layer guard ring is formed along peripheral edges of the chip of the semiconductor chip package device, the guard ring being chamfered at its corner parts; and FIG. 8 is an enlarged partial view showing another embodiment of the present invention in which a metal layer guard ring is formed along peripheral edges of the chip of the semiconductor chip package device, the guard ring being rounded at its corner parts.

According to one characteristic feature of the present invention, the disclosed special shapes of the metal layer guard ring (112) significantly reduce the shear stress applied on its corner parts. As shown in FIGS. 7 and 8, the metal layer guard ring is either chamfered or rounded at its corner parts.

With regard to FIG. 7, the metal layer guard ring (112) on the chip (100) is provided with discrete slits (123, 124). The slits (123) are provided at the corner parts (128) of the chip with the slits (124) being spaced from the slits (123). It is understood that the slits (123, 124) may also be continuous. The tips of the slits (123, 124) have a circular-shape (126), where the diameter "d" of the tips is larger than the width "w" of the slit. The corner parts (128) of the metal layer guard ring (112) are chamfered to increase the number of edges, thereby avoiding stress concentration.

With regard to FIG. 8, the metal layer guard ring (112) on the chip (100) is provided with discrete slits (124, 124A). The slits (124A) are provided at the corner parts (130) of the chip with the slits (124A) being spaced from the slits (124). It is understood that the slits (124, 124A) may also be continuous. The tips of the slits (124, 124A) have a circular-shape (126), where the diameter "d" of the tips is larger than the width "w" of the slit. The corner parts (130) of the metal layer guard ring (112) are rounded. The slits (124A) are formed to have the same rounded shape as that of the rounded corner parts (130).

As described above, by cutting off or rounding off the corner parts of the metal layer guard ring, the shear stress occurring at the corner parts can effectively be reduced. Further, the shear stress at the corner parts of the chip can be further reduced by forming discrete slits (123, 124, 124A) along the corner parts. Moreover, the tips (126) of the slits have a circular-shape, the diameter "d" of which is greater than the width "w" of the slits themselves, leading to the avoidance of stress concentration.

Also as described above, the semiconductor chip devices may have a metal layer guard ring provided with discrete slits at the corner parts of the chip where the metal layer is cut off or rounded, or the slits may be continuous. In either case, the tips of the slits may have circular-shaped tips.

According to the present invention, by making metal layer guard ring chamfered or rounded at the corner parts of the chip, it is possible to prevent the concentration of shear stress. Also, it is possible to minimize the shear stress by providing discrete slits at the corner parts. Moreover, by providing slits having circular-shaped tips, with the diameter of the tips being greater than the width of the slit, it is possible to minimize the shear stress resulting from the thermal displacement mismatch of the molding resin and the silicon substrate during the transfer molding process or thermal cycling.

Although preferred embodiments of the present invention have been described in detail hereinabove, it should be clearly understood that many variations and/or modifications of the basic inventive concepts herein taught, which may appear to those skilled in the art, will still fall within the spirit and scope of the present invention as defined in the appended claims.

What is claimed is:

1. A semiconductor chip package device comprising:
   a semiconductor chip;
   a lead frame electrically connected to the chip and mechanically supporting the chip;
   a metal layer guard ring formed along at least one peripheral edge of an active surface of the chip;
   at least one slit formed on the metal layer guard ring at corner parts of the chip;
   a passivation layer covering the metal layer guard ring, the chip and the lead frame; and
   a package body made of a molding resin encapsulating the passivation layer, the lead frame, the metal layer and the chip;
   said metal layer guard ring being chamfered at corner parts of the chip.

2. The semiconductor chip packaging device of claim 1, wherein said at least one slit is a discrete slit formed at the corner parts.

3. The semiconductor chip packaging device of claim 2, further comprising additional discrete slits spaced from the at least one discrete slit formed at the corner parts.

4. The semiconductor chip packaging device of claim 2, wherein said at least one slit has circular-shaped tips.

5. The semiconductor chip packaging device of claim 3, wherein said additional discrete slits have circular-shaped tips.

6. The semiconductor chip packaging device of claim 4, wherein a diameter of said circular-shaped tips is larger than a width of the at least one slit.

7. The semiconductor chip packaging device of claim 5, wherein a diameter of said circular-shaped tips is larger than a width of the additional discrete slits.

8. A semiconductor chip packaging device comprising:
   a semiconductor chip;
   a lead frame electrically connected to the chip and mechanically supporting the chip;
   a metal layer guard ring formed along at least one peripheral edge of an active surface of the chip;
   at least one slit formed at corner parts of the chip;
   a passivation layer covering the metal layer guard ring, the chip and the lead frame; and
   a package body made of a molding resin encapsulating the passivation layer, the lead frame, the metal layer and the chip;
   said metal layer guard ring being rounded at corner parts of the chip.

9. The semiconductor chip packaging device of claim 8, wherein said at least one slit is a discrete slit formed at the corner parts.

10. The semiconductor chip packaging device of claim 9, further comprising additional discrete slits spaced from the at least one discrete slit formed at the corner parts.

11. The semiconductor chip packaging device of claim 9, wherein said at least one slit has circular-shaped tips.

12. The semiconductor chip packaging device of claim 10, wherein said additional discrete slits have circular-shaped tips.

13. The semiconductor chip packaging device of claim 11, wherein a diameter of said circular-shaped tips is larger than a width of the at least one slit.

14. The semiconductor chip packaging device of claim 12, wherein a diameter of said circular-shaped tips is larger than a width of the additional discrete slits.

15. The semiconductor chip packaging device of claim 9, wherein said at least one slit has a rounded shape corresponding to the rounded metal layer guard ring.

* * * * *